US010371718B2

(12) United States Patent
Albert et al.

(10) Patent No.: US 10,371,718 B2
(45) Date of Patent: Aug. 6, 2019

(54) METHOD FOR IDENTIFICATION OF PROPER PROBE PLACEMENT ON PRINTED CIRCUIT BOARD

(71) Applicant: INTERNATIONAL BUSINESS MACHINES CORPORATION, Armonk, NY (US)

(72) Inventors: Jason T. Albert, Rochester, MN (US); Matthew S. Doyle, Chatfield, MN (US); Christopher J. Engel, Rochester, MN (US); Kahn C. Evans, Rochester, MN (US); Steven B. Janssen, Rochester, MN (US); Matt K. Light, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 110 days.

(21) Appl. No.: 15/350,499

(22) Filed: Nov. 14, 2016

(65) Prior Publication Data

US 2018/0136255 A1     May 17, 2018

(51) Int. Cl.
G01R 1/067     (2006.01)
G01R 31/28     (2006.01)

(52) U.S. Cl.
CPC ..... *G01R 1/06794* (2013.01); *G01R 31/2801* (2013.01); *G01R 31/2806* (2013.01)

(58) Field of Classification Search
None
See application file for complete search history.

(56) References Cited

U.S. PATENT DOCUMENTS

| | | |
|---|---|---|
| 4,667,869 A | 5/1987 | Gen et al. |
| 5,150,041 A | 9/1992 | Eastin et al. |
| 5,321,351 A | 6/1994 | Swart et al. |
| 5,422,575 A | 6/1995 | Ferrer et al. |
| 5,946,791 A | 9/1999 | Baldwin |
| 6,122,042 A | 9/2000 | Wunderman et al. |
| 6,128,818 A | 10/2000 | Baldwin |

(Continued)

FOREIGN PATENT DOCUMENTS

| | | |
|---|---|---|
| WO | 00/26678 A1 | 5/2000 |
| WO | 2007/090447 A1 | 8/2007 |
| WO | 2010/056343 A2 | 5/2010 |

OTHER PUBLICATIONS

Whiitier, T., "Printed Circuit Card Probing Template" IP.com Electronic Publication Date: Feb. 13, 2005, IP.com No. IPCOM000055503D, pp. 1-3.

(Continued)

*Primary Examiner* — Douglas X Rodriguez
(74) *Attorney, Agent, or Firm* — Tutunjian & Bitetto, P.C.; Nathan Rau

(57) ABSTRACT

A method of probing printed circuit boards that includes providing a circuit board design including a plurality of probe points, and selecting a probe point including a location ink from the plurality of probe points in the circuit board design to be probed on a physical printed circuit board design. The method continues with probing at least one probe point of the plurality of probe points with a probe that activates the location ink. Activation of the location ink by the probe indicates the selected probe point including the locating ink.

4 Claims, 7 Drawing Sheets

(56) References Cited

U.S. PATENT DOCUMENTS

| | | |
|---|---|---|
| 6,145,191 A | 11/2000 | Baldwin |
| 6,242,923 B1 | 6/2001 | Seaman et al. |
| 6,710,798 B1 | 3/2004 | Hershel et al. |
| 7,015,711 B2 | 3/2006 | Rothaug et al. |
| 7,256,596 B1 | 8/2007 | Russell |
| 7,691,458 B2 | 4/2010 | Brist et al. |
| 7,859,281 B2 | 12/2010 | Romanov |
| 8,530,248 B2 | 9/2013 | Chen |
| 2008/0148208 A1 | 6/2008 | Jaconsen et al. |
| 2008/0272793 A1 | 11/2008 | Romanov |
| 2009/0251163 A1 | 10/2009 | Yamada et al. |
| 2010/0194414 A1 | 8/2010 | Jun et al. |
| 2011/0279138 A1 | 11/2011 | Mutnury et al. |
| 2015/0173178 A1 | 6/2015 | Morzos |
| 2017/0274699 A1* | 9/2017 | Schwendimann ..... A63H 33/22 |

OTHER PUBLICATIONS

Bocinski, T.E. et al., "Probe Guidance Template and Probe" IP.com Electronic Publication Date: Mar. 3, 2005, IP.com No. IPCOM000088003D, pp. 1-2.

Bowen, S.O. et al., "Probe Accuracy Inspection Tool for In-Circuit Test Fixtures Using PCB Artwork" Ip.com Electronic Publication Date: Mar. 26, 2005, IP.com No. IPCOM000111412D, pp. 1-5.

Wei, S. et al., "Research and Realization of Digital Circuit Fault Probe Location Process" 2008 International Conference on Intelligent Computation Technology and Automation (2008) pp. 897-900.

Katagiri, H. et al., "Interactive nonlinear optimization-based method for correcting the pin probe position in printed circuit board electrical inspections" 2014 IEEE 7th International Workshop on Computational Intelligence and Applications (Nov. 2014) pp. 77-82.

\* cited by examiner

METHOD FOR IDENTIFICATION OF PROPER PROBE PLACEMENT ON PRINTED CIRCUIT BOARD

BACKGROUND

Technical Field

The present disclosure relates generally to printed circuit boards (PCBs), and to preventing errors in probing printed circuit board for testing purposes when the user locates the probe point on the printed circuit board schematic and then goes to place the probe on the physical card.

Description of the Related Art

Electronic circuit boards for computers and other devices typically consist of many integrated circuits mounted on a printed circuit board (PCB). Individual integrated circuit (IC) packages have a semiconductor chip or die enclosed within a protective plastic package. A metal frame consisting of multiple conductive leads provides the electrical interconnect between the enclosed semiconductor chip and components exterior to the plastic package. The PCB has many conductive traces arranged on its surface according to a selected pattern for efficiently transferring electronic signals across the board to and from individual IC packages. Probing is a manual and error prone process involving comparison of PCB artwork on a computer to the physical PCB to find probe points. Translation errors can occur between the signal integrity (SI) engineer and the technicians doing the probing.

SUMMARY

In one embodiment, a method of probing a printed circuit board is described herein that includes providing a circuit board design including a plurality of probe points; and selecting a probe point including a location ink from the plurality of probe points in the circuit board design to be probed on a physical printed circuit board design. The method may continue with probing at least one probe point of the plurality of probe points with a probe that activates the location ink. Activation of the location ink by the probe confirms the selected probe point including said locating ink is being contacted by the probe.

In another aspect, a probe contact is disclosed herein that includes a location ink that aids in probing of the printed circuit board. In one embodiment, the probe contact is present on a printed circuit board (PCB) including at least one trace of electrically conductive material on an insulating substrate, with at least one trace in electrical communication with a via on the PCB. The probe contact includes a locating ink positioned encircling an electrically conductive contact point for a probe that is in contact with the via, wherein the locating ink when activated by the probe reacts by providing a signal. In some embodiments, the locating ink is selected from thermochromatic ink, photochromic ink, electrochromic ink, electromagnetic ink and combinations thereof, wherein the signal is a color change. In other embodiments, the locating ink is an electromagnetic ink, and the signal comprises Magnetic Ink Character Recognition (MICR) characters.

In another aspect, a system for probing printed circuit boards is provided that includes an interface for selecting a probe contact in a printed circuit board design including a plurality of probe contact, wherein at least one of the probe contacts includes a location ink. The system also includes a probe for emitting a signal for activating the location ink of the selected probe contact. The system further includes a comparison module for comparing whether an actual probe contact on a physical board being contacted by a probe emitting the signal for activating the location ink matches the selected contact probe in the printed circuit board design.

In another aspect, a method of probing printed circuit boards that includes providing a circuit board design including a plurality of probe contact. A camera is positioned over a physical printed circuit board including a plurality of probe contacts consistent with the probe points in the circuit board design. A probe is contacted to a selected contact from the circuit board design corresponding to one of the probe contacts the physical printed circuit board. The camera images the probe and the probe contact to the physical printed circuit board. The image taken by the camera of probe contact to the physical printed circuit board is compared to the circuit board design to confirm the probe is to the selected contact.

In another embodiment, a method of probing printed circuit boards is provided that includes providing a circuit board design including a plurality of probe points; taking images of a printed circuit board; and comparing said images of the printed circuit board and the circuit board design to determine the boards orientation. In a following step, a trace is projected onto the printed circuit board design according to the board orientation illustrating probe contacts in accordance with the printed circuit board design.

In another embodiment, a system for probing the circuit boards is described that includes a printed circuit board module including a printed circuit board design; and a camera module for determining using a camera mounted over a physical printed circuit board the orientation of the physical printed circuit board. The system may further include a projector module providing instructions to a projector for projecting a trace image onto the physical printed circuit board to the orientation of the physical printed circuit board. The trace image illustrates probe contacts from the printed circuit board design overlying the printed circuit board. The system may further include a probe for probing the probe contacts according to the trace image.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION

Figure 1:
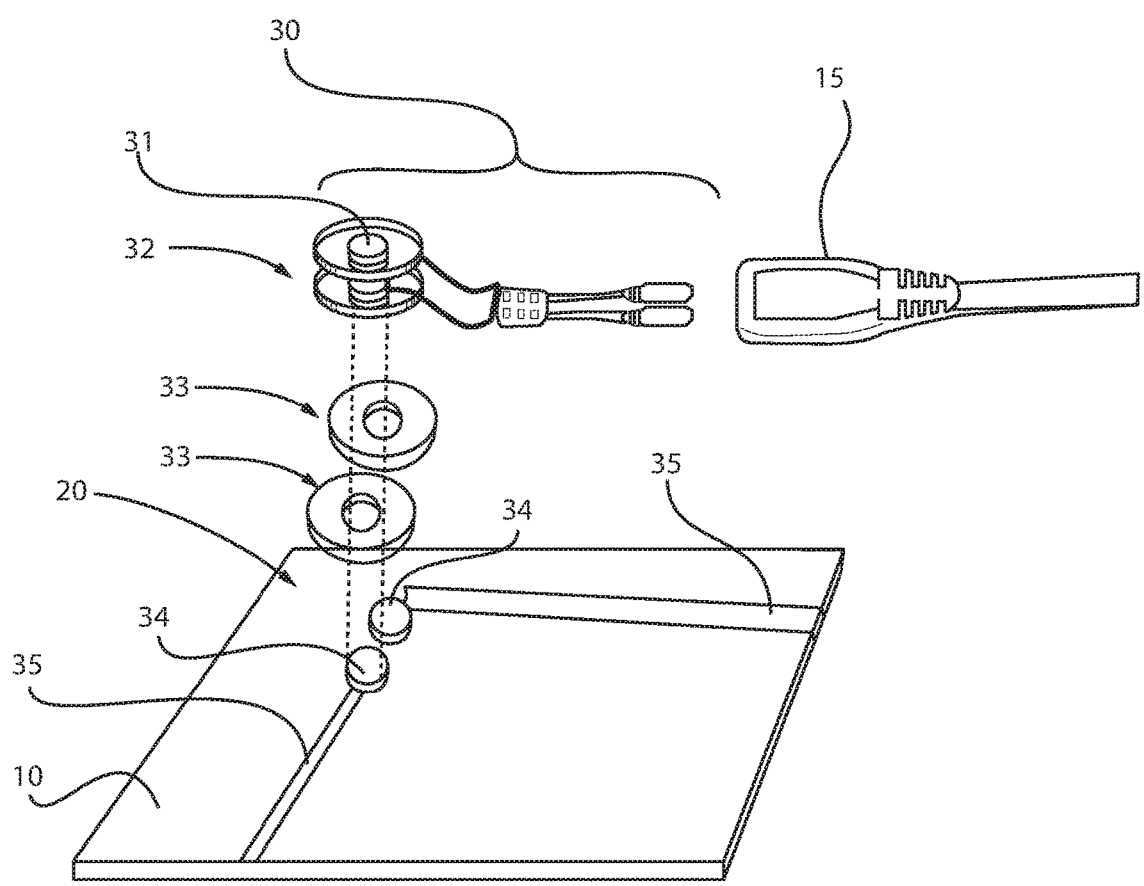
FIG. 1 is a schematic view illustrating one embodiment of a photochromic ink probing system, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

Printed circuit board (PCB) probing is a manual and error prone process involving comparison of PCB artwork on a computer and the physical PCB to find probe points. Translation errors can occur between the signal integrity (SI) engineer and the technicians doing the probing. In some embodiments, the methods and structures disclosed herein provides that if the PCB artwork is known, the manual translation to probe locations is eliminated, thus enabling a number of methods to make finding probe locations easier. In some embodiments, the methods and structures disclosed herein advantageously remove human error from the translation of artwork to the actual printed circuit board (PCB). The methods and structures also allow the SI engineer to load in probe points to be checked by the lab technician.

In some embodiments, the methods and structures disclosed herein prevent errors when the user locates the probe point on the printed circuit board schematic and then goes to place the probe on the physical printed circuit board card. In some embodiments, the scope being used by the user knows the schematic of the card, so that the user can select the probe point on the scope. Selection of the probe point can then drive a number of actions to make finding the probe location easier. As will be described in greater detail below, the probe points can be marked with special inks, in which the probe can be configured to activate the ink for the selected probe point.

In some examples, expected probe locations on the PCB can be marked with special inks, such as photochromic ink, thermochromatic ink, electromagnetic ink, electrochromic material, and combinations thereof. In other examples, the expected probe locations on the PCB can be examined photographically, or by using images of trace locations onto the PCB, or by employing a virtual reality environment to aid in the selection of probe points. Further details of the methods and structures of the present disclosure are now provided with reference to FIGS. 1-7.

FIGS. 1-4 illustrate different methods for probing printed circuit boards that each include a device knowing a circuit board design including a plurality of probe points, in which the device is capable of driving a probe location verification apparatus. The method also includes employing a printed circuit board containing a location ink positioned at a probe point. The method also employs a verification apparatus that measures the selected location ink to detect and verify probe placement on the printed circuit board. The device knowing a circuit board design may be provided by a scope that works in conjunction with a probe 15. The scope may have a display for interacting with the user, in which the user may select the point on printed circuit board that they would like to probe. The combination of the probe and scope may then be used to determine if the user is probing with correct probe contact point they have selected on the scope with the probe 15. In some embodiments, the scope may be integrated into a same device with the probe 15.

FIG. 1 illustrates one embodiment of a photochromic ink probing system. In this embodiment, when the printed circuit board (PCB) 10 is designed, expected probe locations 20 are chosen and marked with a photochromic ink. Photochromic materials change reversibly color with changes in light intensity. Usually, they are colorless in a dark place, and when light or ultraviolet radiation is applied molecular structure of the material changes and it exhibits color. When the relevant light source is removed the color disappears. Photochromic inks display the properties of photochromic materials.

When the probe locations 20 of the printed circuit board (PCB) 10 are marked with photochromic ink, the method includes probing the printed circuit board (PCB) 10 with a probe 15 that measures the location ink. More specifically, the printed circuit board design (PCB) is known to a device capable of driving a number of different location verification apparatuses, e.g., the probe, where on that device the user selects the location to be probed, i.e., probe location, and the probe 15 is able to sense the location ink, which reduces the incidence in the occurance of translation errors during printed circuit board (PCB) probing. For example, the probe 15 indicates to the user conducting the printed circuit board (PCB) probe that they are probing at the correct probe location 20 for the design of the printed circuit board (PCB).

In some embodiments, with photochromic ink, the probe 15 emits a light that causes the probe locations including the photochromic ink to illuminate. Examples of photochromic materials suitable for use in photochromic ink can include triarylmethanes, stilbenes, azastilbenes, nitrones, fulgides, spiropyrans, naphthopyrans, spiro-oxazines, quinones and combinations thereof.

In some embodiments, each probe location 20 is printed with a different ink gradient. For example, at least two different probe locations 20 can each have a different gradient of photochromic ink that provides at least two different ink gradients that illuminate at different wavelengths. The term "different gradient" when referring to photochromic inks denotes that the inks are activated at different light wave lengths. They would all be applied to the board at the same thickness. The ink at probe point 1 (a first probe location 20)

would be activated at one wavelength of UV light, probe point 20 (a second probe location 20) at a separate wavelength, etc.

In some embodiments, when the user selects the point to probe on the scope, the physical probe 15 would then put out that wave length of light so that the ink in the printed circuit board (PCB) 20 would activate when over it, thus confirming the probe is at the right location for tracing the physical printed circuit board (PCB) 20 relative to the printed circuit board design, i.e., the printed circuit artwork. More specifically, in some embodiments, with the scope knowing the artwork, i.e., PCB design, the location to probe is selected. In some embodiments, the scope activates a light source in the probe 15 to illuminate the ink, i.e., ink present in the probe point 20, at that frequency. The probe 15 is the run over the printed circuit board (PCB), where the ink can luminesce when probe is proximate to the probe location on the printed circuit board (PCB) that contains the inks corresponding to the wavelengths emitted by the probe. The method also employs a probe verification apparatus that measures the selected location ink to detect and verify probe placement on the printed circuit board. The probe verification apparatus can detect activation of the ink that is integrated into the probe point 20 by the probe 15.

In some embodiments, when the illuminated photochromic ink is present in the PCB then at least one probe point contacted by the probe 15 matches the selected probe point of the circuit board design on the scope by the user there are substantially no translation errors between the circuit board design and where the operator is probing the physical printed circuit board during probing operations.

Referring to FIG. 1, in some embodiments the methods and structures disclosed herein provide a new photochromic probe assembly 30 that provides the probe contact 20 on the printed circuit board. The photochromic probe assembly 30 includes a probe conductor 31 that is encircled in an ultraviolet probe pad illuminator 32. The probe conductor 31 is typically composed of a metal, such as copper and/or aluminum and/or tungsten and/or titanium. The ultraviolet probe pad illuminator 32 which encircles the probe conductor 31 can be glass ring capable of projecting the UV light generated back on the scope. In some embodiments, the probe conductor 31 is in electrical communication with the printed circuit board signal via 34, which is also composed of an electrically conductive material, such as a metal, e.g., copper, silver, platinum, titanium or a combination thereof. Each of the probe conductors 31 is in electrical communication with a trace 35 of the printed circuit board 10. The traces 35 are typically composed of a metal, e.g., copper, silver, platinum, titanium or a combination thereof, that provides the electrical communications media of the printed circuit board (PCB) 10. The substrate of the printed circuit board (PCB) 10 is typically a dielectric material, such as FR4, i.e., glass-reinforced epoxy laminate. The photochromic ink is typically positioned encircling the probe conductor 31 between the substrate of the printed circuit board (PCB) 10 and the ultraviolet probe pad illuminators 32, in which the structure including the photochromic ink may be referred to as photochromic ring 33. In some embodiments, the photochromic ink is present in the solder mask and is a part of the final printed circuit board (PCB) 10. It could also be placed in any number of overlay materials that can be applied to the printed circuit board (PCB) 10. One example of an overlay material that the photochromic ink may be integrated in, e.g., as a photochromic ring 33, is DuPont™ Pyralux® coverlay composite, which is a polyimide film coated with a B-staged modified acrylic adhesive. In some embodiments, the ring geometry of the photochromic ring 33 is positioned around the conductive feature 31 for the at least one probe contact point 20, wherein the conductive feature 31 for the at least one probe point is in electrical communication with a trace line 35 of the printed circuit board (PCB) 10.

In some embodiments, the probe 15 emitting the right wavelength light for activating the ink contained in the photochromic ring 33, contacts or comes in close proximity with the photochromic probe assembly 30, in which the ink contained in the photochromic ring 33 luminesces in response to the wavelength of the light emitted by the probe 15, wherein the luminescence is amplified by the ultraviolet probe pad illuminators 32 for being viewed by the operator running a test of the printed circuit board 10.

Figure 2:
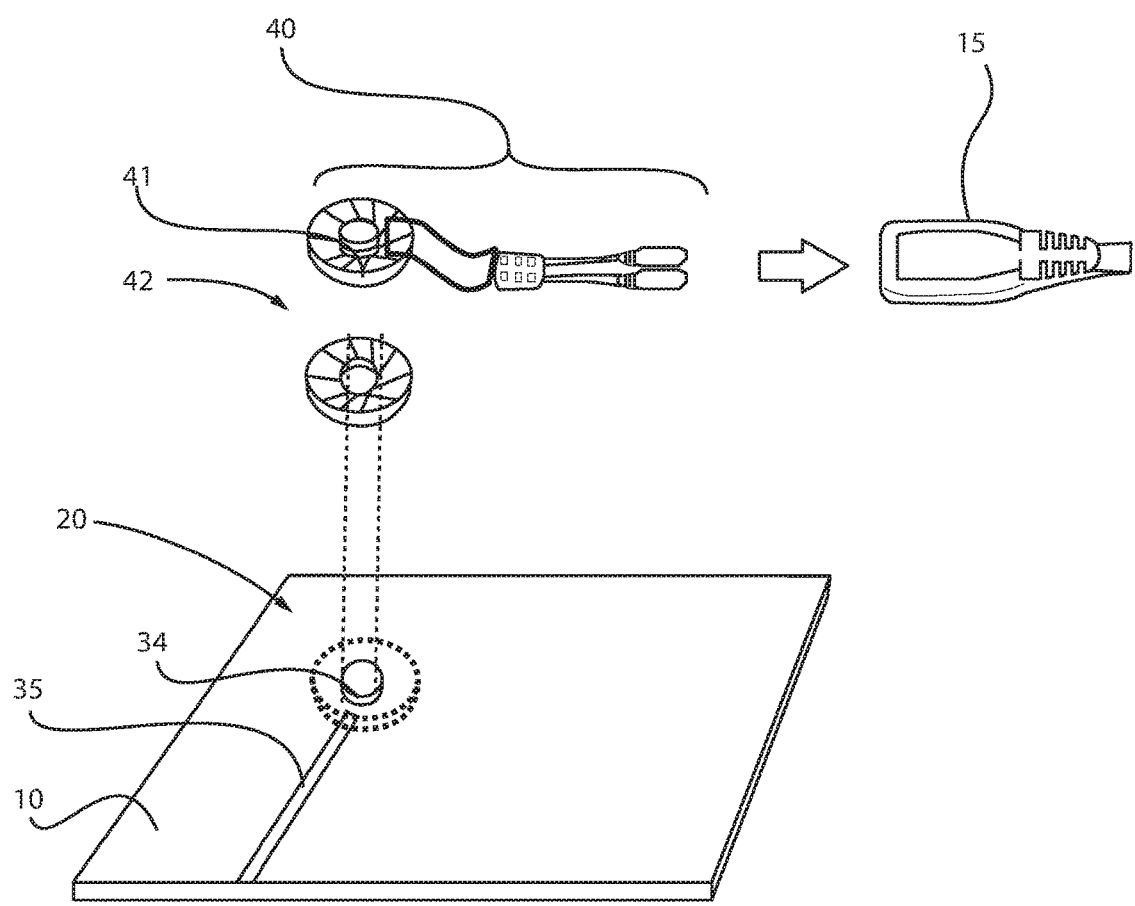
FIG. 2 is a schematic view illustrating one embodiment of an electrochromics ink probing system, in accordance with one embodiment of the present disclosure.

FIG. 2 depicts one embodiment of an electrochromics ink probing system. In some embodiments, when a printed circuit board (PCB) 10 is designed, an electrochromic material, e.g., electrochromic ink, can be used within the printed circuit board (PCB), e.g., within the protective layers of the printed circuit board (PCB), in the expected areas of probing for the printed circuit board (PCB). Electroluminescence (EL) is an optical phenomenon and electrical phenomenon in which a material emits light in response to the passage of an electric current or to a strong electric field. Electrochromic inks have electroluminescent properties. Examples of electrochromic ink can include a liquid including metal oxides, viologens (in solution and as adsorbed or polymeric films), conjugated conducting polymers, metal coordination complexes (as polymeric, evaporated, or sublimed films), metal hexacyanometallates and combinations thereof.

During testing, i.e., circuit board probing, with the scope knowing the artwork, the location to be probed (with probe 15) is selected on the scope. The scope can then emit a particular electrical condition, e.g., voltage, through the probe 15 to the probe contact site on the printed circuit board (PCB) 10 that includes the electrochromic material, e.g., electrochromic ink. The voltage is typically specific to the electrochromic material at the selected location. The electrochromic material typically changes color when contact was made, confirming the correct location is being probed, assuming the electrochromic material is reactive to the electrical condition emitted by the probe 15.

The bistable properties of electrochromic material can be used to provide persistent identification of probe locations after the activating voltage has been removed. This is useful for rechecking probe locations as multiple tests are run over the course of an experiment. In some embodiments, when the probe locations 20 of the printed circuit board (PCB) 10 are marked with electrochromic ink, the method includes probing the printed circuit board (PCB) 10 with a probe 15 that measures the location ink to avoid translation errors between printed circuit board design and the points being probed by the operator during probing operations being conducted on the printed circuit board. With electrochromic ink integrated into the probe locations 20, to cause the probe locations 20 to be illuminated, the probe 15 emits an electrical condition, e.g., an electric field, current, voltage or combination thereof, that causes the probe locations 20 including the electrochromic ink to illuminate.

Electrochromic ink typically requires two electrodes. In one embodiment, one electrode is integrated into the printed circuit board (PCB) 10, and the second electrode is positioned in the probing device 15. In one example, at least two different probe locations 20 can each have a different gradient of electroluminescent ink that provides that the at least two different ink gradients illuminate when exposed to different electrical phenomena. The term "different gradient" when referring to electroluminescent inks denotes that the inks are activated under different electrical conditions, e.g., electrical fields, currents and/or voltages. They can all be applied to the board at the same thickness. The ink at probe point 1 (a first probe location 20) would be activated at one electrical condition, and probe point 2 (a second probe location 20) at a separate different electrical condition, etc. In some embodiments, when the user selected the point to probe on the scope, the physical probe 15 would then put out that electrical condition so that the ink in the printed circuit board (PCB) 10 would activate when over it, thus confirming the probe is at right location for tracing the physical printed circuit board (PCB) 10.

In some embodiments, with the scope for probing the printed circuit board 10 knows the artwork of the PCB design, and the user conducting the probing on the physical printed circuit board (PCB) selects the location to probe on the scope. The scope activates an electrical condition in the probe 15 to illuminate the ink, i.e., ink present in the probe point 20, for that set of electrical properties, e.g., electric field strength, current and/or voltage. The probe 15 is the run over the printed circuit board (PCB), where the ink can luminesce when the probe is proximate to the probe location on the printed circuit board (PCB) that contains the inks corresponding to the electrical conditions emitted by the probe. In some embodiments, when the illuminated electrochromic ink that is present in the at least one probe point being contacted by the probe matches the selected probe position by the user on the scope, the incidence of translation errors can be substantially eliminated.

In some embodiments, when the probe illuminates the photochromic ink that is present in the PCB, and at least one probe point that matches the selected probe contact entered into the scope by the user there are substantially no translation errors between the circuit board design and where the operator is probing the physical printed circuit board during probing operations.

Referring to FIG. 2, in some embodiments the methods and structures disclosed herein provide a new electrochromic probe assembly 40 that provides the probe contact 20 on the printed circuit board. The electrochromic probe assembly 40 includes a probe conductor 41 that is encircled in an electrochromic material that changes to a specific color when the appropriate voltage is applied. The color change can be to a blue, red, yellow, black and/or green color, etc. The probe conductor 41 is typically composed of a metal, such as copper and/or aluminum and/or tungsten and/or titanium. In some embodiments, the probe conductor 41 is in electrical communication with the printed circuit board signal via 34, which is also composed of an electrically conductive material, such as a metal, e.g., copper, silver, platinum, titanium or a combination thereof. Each of the probe conductors 41 is in electrical communication with a trace 35 of the printed circuit board 10. The traces 35 are typically composed of a metal, e.g., copper, silver, platinum, titanium or a combination thereof, that provides the electrical communications media of the printed circuit board (PCB) 10. The electrochromic ink is typically positioned encircling the probe conductor 41 on the substrate of the printed circuit board (PCB) 10 and may be referred to as electrochromic ring 42. In some embodiments, the electrochromic ink is present in the solder mask and is a part of the final printed circuit board (PCB) 10. It could also be placed in any number of overlay materials that can be applied to the printed circuit board (PCB) 10. One example of an overlay material that the photochromic ink may be integrated in, e.g., as a electrochromic ring 42, is DuPont™ Pyralux® coverlay composite, which is a polyimide film coated with a B-staged modified acrylic adhesive. In some embodiments, the ring geometry of the electrochromic ring 42 is positioned around a conductive feature for the at least one probe contact point 20, wherein the conductive feature a for the at least one probe point is in electrical communication with a trace line 35 of the printed circuit board (PCB) 10.

In some embodiments, the probe 15 emitting the right voltage for activating the ink contained in the electrochromic ring 42, contacts or comes in close proximity with the electrochromic probe assembly, in which the ink contained in the electrochromic ring 42 luminesces in response to the voltage provided by the probe 15.

Figure 3:
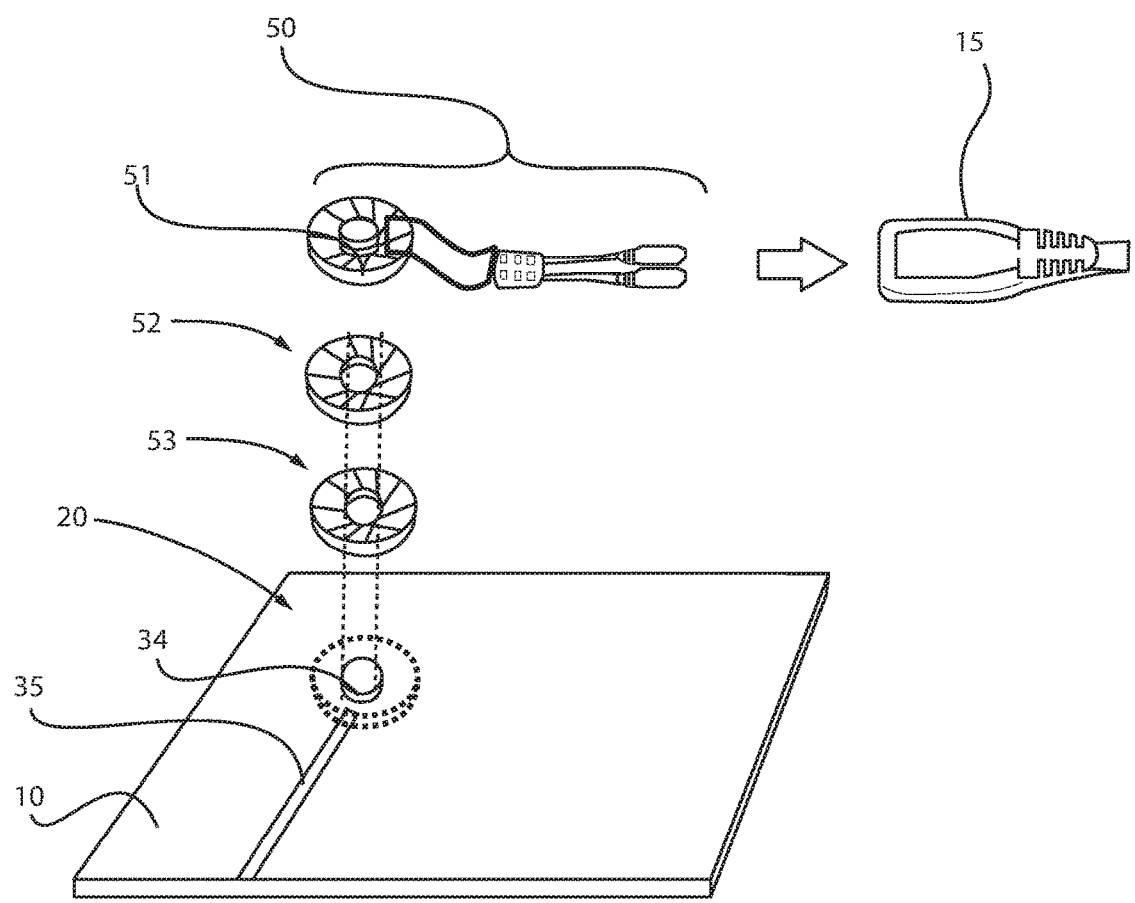
FIG. 3 is a schematic view illustrating one embodiment of a thermochromics via probing system, in accordance with one embodiment of the present disclosure.

FIG. 3 illustrates one embodiment of a thermochromatic via probing system. In this embodiment, when the printed circuit board (PCB) is designed, expected probe locations 20 are chosen and marked with thermochromatic ink. Thermochromatic inks take advantage of thermochromism, which refers to materials that change their hues in response to temperature fluctuations. Examples of thermochromatic ink include a liquid crystal composition, Leuco dye or a combination thereof. Thermochromatic inks may change from color to colorless; color to color; and colorless to color. In some embodiments, the temperature points which trigger color change effect may range from 25° C. to 110° C.

In some embodiments, each location that provides a probe contact 20 is printed with a different temperature gradient ink. Gradient refers to inks that are activated at different temperatures. They can all be applied to the board at the same thickness. The ink at probe point 1 (a first probe location 20) would be activated at 100° F., probe point 2 (a second probe location 20) at 102° F. Since the activation temperature and resulting color changes based on manufacturing, the illumination of a specific color and/or color gradient is accomplished primarily by the pigment selected by the end-user for the thermochromatic ink.

Referring to FIG. 3, to activate the thermochromatic ink, the probe 15 typically includes a means of emitting heat. In some examples, when the user selected the point to probe on the scope, the physical probe 15 would then put out that temperature so that the thermochromatic ink in the printed circuit board 10 would activate when over it confirming they were in the right location. With the scope knowing the artwork, the location to probe 15 is selected in the scope by the user. The scope activates a heat source in the probe 15 to illuminate the thermochromatic ink at that temperature. The probe is then run over the printed circuit board (PCB) 10 until the selected location is found via the ink being activated.

In some embodiments, when the illuminated thermochromatic ink is present in the PCB at least one probe point contacted by the probe 15 matches the selected probe point of the circuit board design on the scope by the user there are substantially no translation errors between the circuit board design and where the operator is probing the physical printed circuit board during probing operations.

Referring to FIG. 3, when the locating ink is thermochromatic ink, the at least one probe point (probe location 20) includes an thermochromic probe assembly 50 of a thermochromatic activator head 52, which may be one of a peltier device and a piezoelectric device for heating or cooling, that is atop a thermochromatic ring 53 containing said location ink. The thermochromatic ring contains said locating thermochromatic ink and is positioned around a conductive feature 51 for the at least one probe point. The conductive feature 51 for the at least one probe point is in electrical communication with a trace line 35 of the printed circuit board. The conductive feature 51 is also in communication with a via 34 of the PCB 10.

In some embodiments, the thermochromatic ink is present in the solder mask and is a part of the final printed circuit board (PCB) 10. It could also be placed in any number of overlay materials that can be applied to the printed circuit board (PCB) 10. One example of an overlay material that the photochromic ink may be integrated in, e.g., as a thermochromatic ring 53, is DuPont™ Pyralux® coverlay composite, which is a polyimide film coated with a B-staged modified acrylic adhesive. In some embodiments, the ring geometry of the thermochromatic ring 53 is positioned around the conductive feature 31 for the at least one probe contact point 20, wherein the conductive feature 31 for the at least one probe point is in electrical communication with a trace line 35 of the printed circuit board (PCB) 10.

Figure 4:
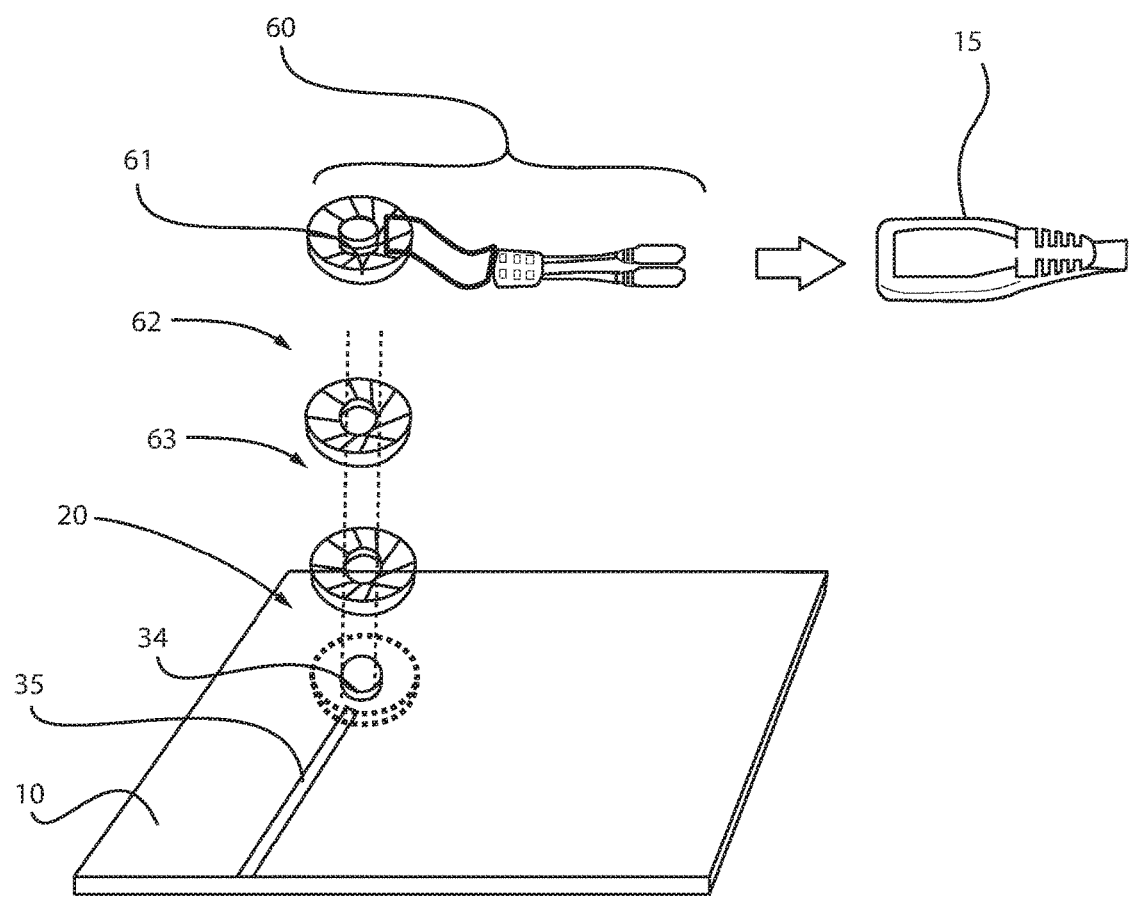
FIG. 4 is a schematic view illustrating one embodiment of an electromagnetic ink probing system, in accordance with one embodiment of the present disclosure.

FIG. 4 depicts one embodiment of an electromagnetic ink probing system. In some embodiments, a printed circuit board (PCB) 10 is designed, in which electromagnetic ink with Magnetic Ink Character Recognition (MICR) characters is to be used within the top protective layer of the board. Magnetic Ink Character Recognition (MICR) ink contains a magnetic pigment or a magnetic component in an amount sufficient to generate a magnetic signal strong enough to be readable via a MICR reader. Magnetite (iron oxide, $Fe_2O_3$) is a common magnetic material used in MICR ink jet inks.

In some embodiments, the MICR characters can be programmed to provide multiple types of information to an oscilloscope, in which the scope probe can detect MICR characters. In some embodiments, when the locating ink is a magnetic ink, the probe 15 may be an MICR program scanner. Various information, including, but not limited to net names could be read in from the MICR characters. In some embodiments, when the locating ink is an electromagnetic ink, probing the printed circuit board (PCB) 10 includes applying voltage to the at least one probe point 20 at a voltage that causes changes in magnetic characterization information that is detectable by through an oscilloscope for the electromagnetic ink.

In some embodiments, when the magnetic characterization information change for the electromagnetic ink is present in the PCB, and at least one probe point contacted by the probe 15 matches the selected probe point of the circuit board design on the scope by the user, there are substantially no translation errors between the circuit board design and where the operator is probing the physical printed circuit board during probing operations.

In one example, when designing the board, MICR characters can be put into the PCB design. When probing, the operator would then select the intended location on the scope. When the operator is over that location, the MICR reader embedded in the scope probe 15 would be able to confirm the operator was in the right location by reading the MICR characters off the printed circuit board.

Referring to FIG. 4, when the locating ink is electromagnetic ink, the at least one probe point (probe location 20) includes an MICR program scanner 62 and a locating ring of electromagnetic ink 62 that are positioned around a conductive feature 61 for the at least one probe point 20. The conductive feature 61 for the at least one probe point is in electrical communication with a trace line 35 of the printed circuit board. The conductive feature 61 is also in communication with a via 34 of the PCB 10.

In some embodiments, the electromagnetic ink is present in the solder mask and is a part of the final printed circuit board (PCB) 10. It could also be placed in any number of overlay materials that can be applied to the printed circuit board (PCB) 10. One example of an overlay material that the photochromic ink may be integrated in, e.g., as a thermochromatic ring 63, is DuPont™ Pyralux® coverlay composite, which is a polyimide film coated with a B-staged modified acrylic adhesive.

Figure 5:
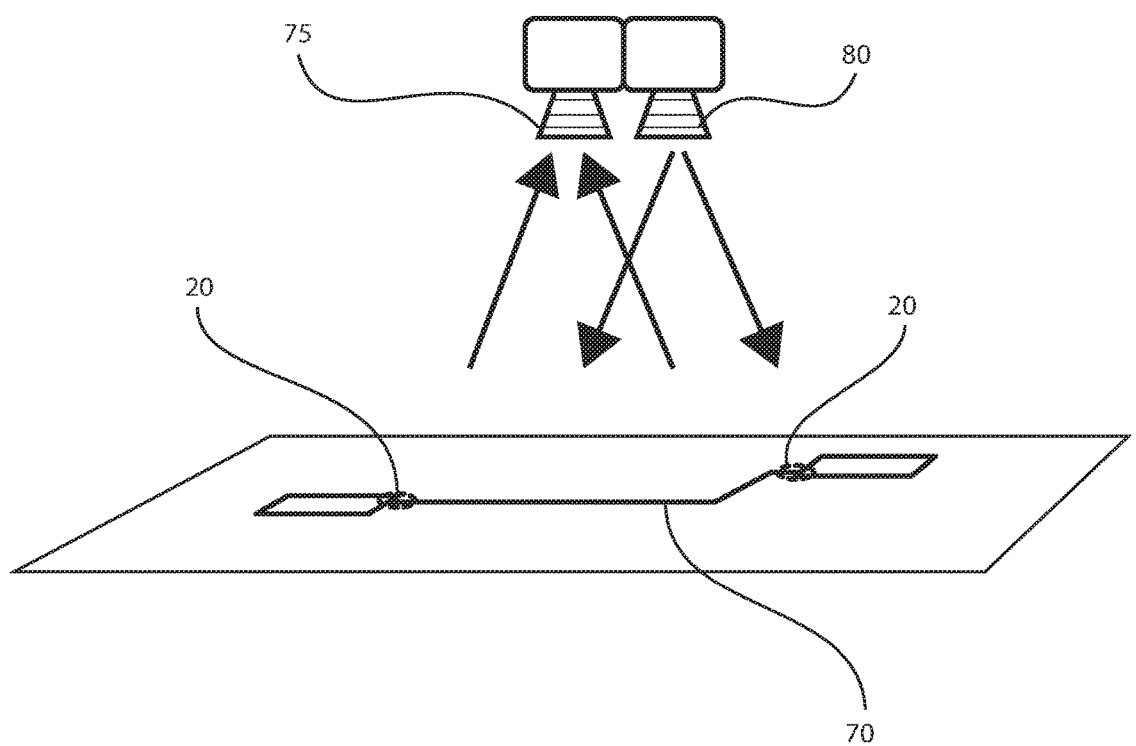
FIG. 5 is a schematic view illustrating one embodiment of a printed circuit board testing system that employs a camera and/or a projector to compare a circuit board design to a physical circuit board to determine whether the physical circuit board corresponds to the circuit board design, in accordance with one embodiment of the present principles.

FIG. 5 is a schematic view illustrating one embodiment of a printed circuit board probing system that employs at least one of a camera 75 and a projector 80 to compare a circuit board design to a physical printed circuit board 10 to determine whether the probe points contacted by the user on the physical printed circuit board 10 corresponds to the intended probe points of the circuit board design.

In some embodiments, the camera 75 may be employed without the projector 75 to determine whether the user conducting the printed circuit board probing is contacting the correct probe contact 20 with the probe 15. The method of probing printed circuit boards (PCB) 10 may include providing a circuit board design including a plurality of probe points 20; forming a printed circuit board (PCB) 10 to the printed circuit board design; and positioning a camera 75 over the circuit board. A device knowing a circuit board design including a plurality of probe points provides the interface for the user conducting the printed circuit board (PCB) probing selects the probe points 20 from which the probing is to be conducted. The device is capable of driving a probe location display apparatus, in which the output of the display apparatus can be used to correlate the probe points between the printed circuit board and the printed circuit board design. This system helps the user to ensure that the user is contacting the correct probe points on the physical printed circuit board (PCB) with the probe during the probing of the printed circuit board (PCB) for testing.

In some embodiments, once the camera 75 is positioned over the PCB 10, the camera 75 may take images of the PCB 10, wherein the images taken by the camera 75 are compared to the printed circuit board artwork. In one example, the camera 75, i.e., optical camera, may be used to interpret where on the printed circuit board (PCB) where a probe is located. The camera 75 could be mounted over the printed circuit board (PCB) 10 in a fixed position. A cell phone camera could also be used. The camera data is fed to a computer or scope (as illustrated in the system 100 depicted in FIG. 6) that has knowledge of the PCB layout artwork/schematics. Information related to where on the PCB the probe is can then be shown on a display. For example, the display may illustrate an overlay of the PCB image from the camera on an image of the printed circuit board design, i.e., printed circuit board artwork. The apparatus depicted in FIG. 5 may also be employed with the above described printed circuit boards that include the locating ink described with reference to FIGS. 1-4. The information displayed picked up from the probe 15 and/or camera 75 could include signal/net names and/or signal/net types. The information displayed may also include the trace path and other end of the signal captured by the camera and probe 15, 75. This information over-lay can be similar in effect to "mousing-over" links to display additional information. As the probe 15 moves, the information displayed would change and update based on the new position as captured by the camera 75.

Still referring to FIG. 5, in some other embodiments, the method for probing the circuit board 10 may include forming a printed circuit board 10 to a printed circuit board design; and positioning a projector 80 over the circuit board 10, wherein the projector 80 projects a trace image 70 of the printed circuit board design onto the physical printed circuit board 10 to guide an operator conducting a probing test to the correct probe locations on the physical printed circuit board to help eliminate translation errors between printed circuit board design and the printed circuit board 10. In some embodiments, the trace image 70 allows for a user to visually confirm that they are probing the correct probe contact 20 on the physical printed circuit board 10, which matches the design, i.e., artwork. In other embodiments, the trace image 70 can be photographically captured on the printed circuit board in which a computer (as illustrated in the system 100 depicted in FIG. 6) may compare the trace image 70 and the physical printed circuit board (PCB) to guide an operator conducting a probing test to the correct probe locations on the physical printed circuit board to help eliminate translation errors between printed circuit board design and the printed circuit board 10.

In one embodiment, the camera 75 may also be mounted, e.g., in a fixed position, over the circuit board 10, and can be used to determine board orientation for projecting the trace image 70. The camera data can be fed to a computer (as illustrated in the system 100 depicted in FIG. 6) or scope that has knowledge of the PCB layout artwork/schematics.

The user selection of probe locations is then fed to an overlay device (for example through an user input device (as illustrated in the system depicted in FIG. 6) to show the selections, i.e., traces, on the printed circuit board (PCB). The projector 80 may be a dynamic laser overlay or an optical projector that can illuminate the physical trace image 70 on the printed circuit board (PCB) 10 making it visible to the user. In some embodiments, the trace image 70 allows quick identification of the trace routing through the board to aid in observation of potential noisy areas. For example, the trace image 70 may allow for quick identification of the other end of the trace.

In some embodiments, the camera 75 that is positioned over the printed circuit board 10 takes images of the projected trace image 70 that has been projected onto the printed circuit board 10. The images of the projected trace image 70 projected onto the physical printed circuit board 10 that are taken by the camera 75 may be compared to the printed circuit board artwork to determine whether the user conducting the printed circuit board (PCB) probing is probing, i.e., contacting with a probe 15, a correct probe contact 20. This method can ensure that translation errors by the user/operating conducting a printed circuit board probe between printed circuit board (PCB) design and the printed circuit board (PCB) 10 are substantially eliminated.

Figure 6:
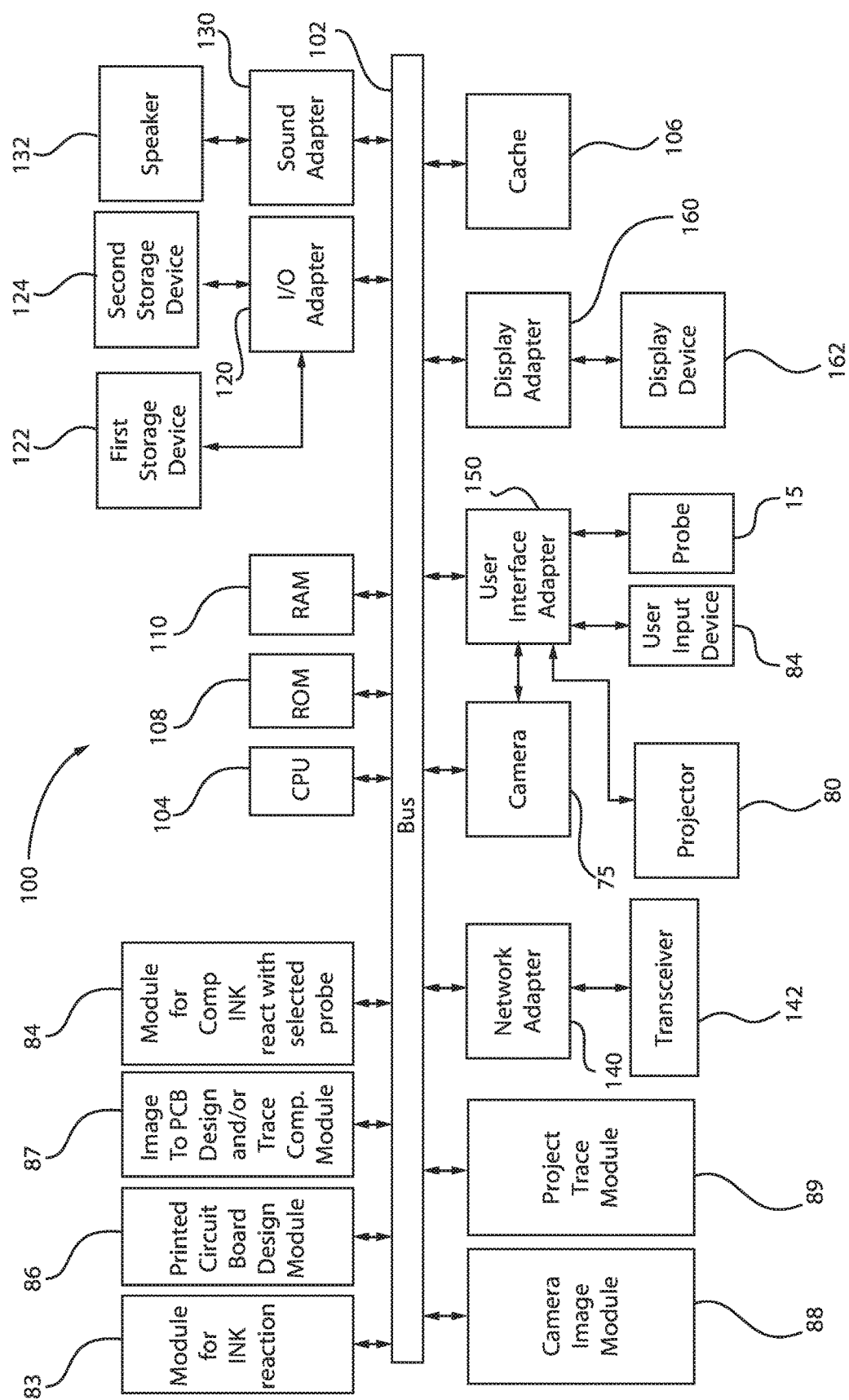
FIG. 6 is a block diagram of a system for printed circuit board testing system, in accordance with one embodiment of the present disclosure.

FIG. 6 illustrates one embodiment of a processing system 100 including a scope that works in combination probe 15 for contacting the ink containing probe contacts 20 for the embodiments described with reference to FIGS. 1-4, or the camera 75 and/or the projector 80 for the embodiments depicted in FIG. 5.

In some embodiments, the processing system 100 includes at least the probe 15 as one input to the system, as described in the methods described with reference to FIGS. 1-4, and may further include the camera 75 as another input to the system 100, and a projector 80 as another input to the system 100, as described in the methods described with reference to FIG. 5.

The processing system 100 also includes a printed circuit board design module 86, which may include a form of memory for instructions relating to the probe contacts 20 on the circuit board artwork for comparison with where the probe 15 is contacting the physical circuit board 10. The processing system 100 may also include a module for ink reaction 83. The module for ink reaction 83 may include memory for instructions relating to measuring the reaction of probe contact 20 including thermochromatic ink, photochromic ink, electromagnetic ink, and/or electrochromic ink, as described with reference to FIGS. 1-4. The measurements may be taken by the probe 15 and stored for analysis with the module for comparison of the ink reaction with the selected probe location 84. The module for comparison of the ink reaction with the selected probe location 84 analyzes the printed circuit board design from the printed circuit board design module 86, the selection of the probe contact 20 by the user conducting a printed circuit board probe entered by the user through the user input device 81, e.g., scope; and makes a calculation from the data stored on the module for ink reaction 83 whether the probe 15 is contacted the selected probe contact 20 on the physical circuit board matches the selected probe contact on the printed circuit board artwork entered into the scope by the user input device 81.

The process system 100 can also include a camera image module 88, which may include a form of memory for storing instructions relating to the functionality of the camera 75 in taking images of the printed circuit board 10 for comparison of the probing of the printed circuit board 10 to the probe points selected for the printed circuit board design/artwork, which may be stored on the printed circuit board design module 86. The process system 100 may also include a projector image module 89, which may include a form of memory for storing instructions relating to the functionality of the projector 80 in producing the projected trace image 70 for comparison of the printed circuit board 10 to the printed circuit board design/artwork, which may be stored on the printed circuit board design module 86. The process system 100 may also include an image to PCB design and/or trace comparison module 89. This module may include a form of memory for storing instructions executable by a series of processors for comparing the printed circuit board design/ artwork that can be stored on the printed circuit board design module 86 with the images taken by the camera following the instructions of the camera image module 88. The images may include the projected trace image 70 being projected onto the physical circuit board that was produced by the projector 80 using the instructions stored on the projector image module 89. The PCB design and/or trace comparison module 89 using the aforementioned images captured by the camera 75, as well as the trace image 70, can determine whether the probe contacts being contacted by the user on the physical circuit board (PCB) 10 matches the selected probe points on the circuit board design/artwork.

The processing system 100 also includes at least one processor (CPU) 104 operatively coupled to other components including the camera image module 88, the projector image module 89, the printed circuit board design module 86 and the image to PCB design and/or trace comparison module 89 via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

The camera 75 may be a first input device that is also operatively coupled to the system bus 102, which may be coupled through a user interface adapter 150. As will be further described below a projector 80 may also be operatively coupled to the system bus 102, which may be coupled through a user interface adapter 150.

A user input device 81 may also be operatively coupled to system bus 102 by user interface adapter 150. The user input device 81 may provide the above referenced scope that interacts with the probe 15 to determined whether a operating conducting printed circuit board (PCB) probing is contacting the intended probe contacts 20, and thus avoiding translation errors. The user input device 81 can be any of a keyboard, a mouse, a keypad, a motion sensing device, a microphone, a device incorporating the functionality of at least two of the preceding devices, and so forth. The user input device 81 can include a screen for displaying printed circuit board (PCB) artwork that allows the user to selected probe contacts 20 for probing. The user input device an also include a screen for displaying a signal from the system 100 that the user is contacting the correct probe contact 20 with the probe 15 on the physical printed circuit board (PCB), which is consistent with the selected probe contact from the printed circuit board (PCB) artwork. The camera 75, projector 80, probe 15 and user input device 81 may each be used to input and output information to and from system 100.

Of course, the processing system 100 may also include other elements (not shown), as readily contemplated by one of skill in the art, as well as omit certain elements. For example, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Figure 7:
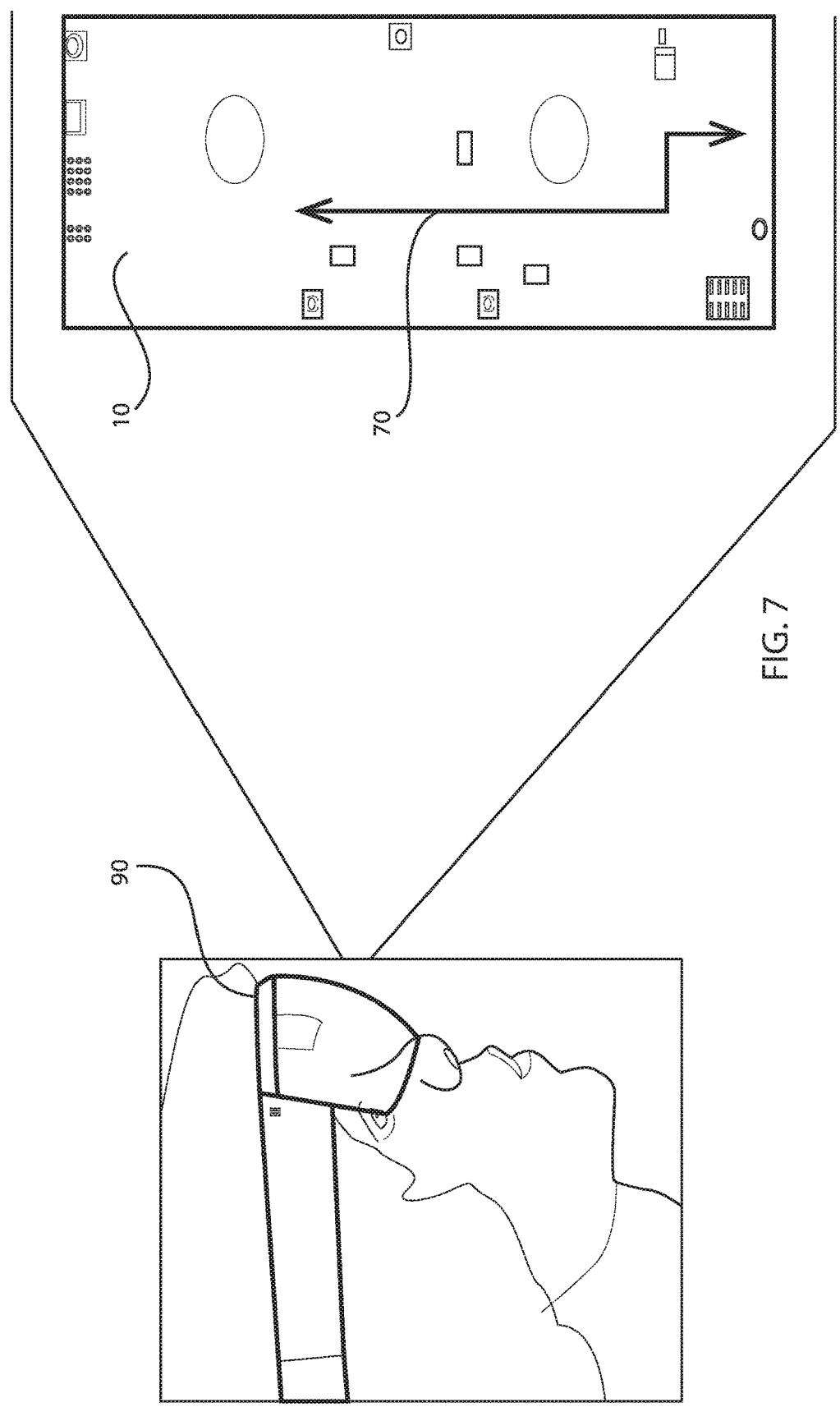
FIG. 7 is a schematic view illustrating a printed circuit board testing system that employs a virtual reality environment to compare a circuit board design to a physical circuit board to determine whether the physical circuit board corresponds to the circuit board design, in accordance with one embodiment of the present disclosure.

For example, the physical projector may be substituted with a virtual reality environment. FIG. 7 illustrated one embodiment of a printed circuit board testing system that employs an augmented reality environment to compare a circuit board design to a physical circuit board 10 to determine whether the at least one probe point probed by the user matches the selected probe contact in the printed circuit board artwork so there are substantially no translation errors during the PCB probing. The virtual reality environment scope 90 employs transparent lenses so that the user can see the physical printed circuit board 10, but the virtual reality environment scope 90 projects the trace image 70 onto the lenses in a virtual/augmented reality setting so that it appears that the trace image 70 is present on the physical circuit board 10. The "virtual" scope could be displayed within an augmented reality (AR) field of vision. For example, selected traces and/or pads can be displayed in real time on the printed circuit board 10 to visually determine whether the physical printed circuit board (PCB) 10 matches the printed circuit board design/artwork, or whether translational errors are present. In some embodiments, the printed circuit board testing system that employs the virtual reality environment provides that no disruption is present when switching between the physical circuit board (PCB) 10 and the physical scope display. In addition to the trace image 70, other information, such as information from electromagnetic near-field scanners (EM scanners) could also be overlaid onto the virtual reality environment scope 90. The printed circuit board testing system that employs a virtual reality environment depicted in FIG. 7 may employ multiple modes of operation. For example, probe locations can be preselected by the user and shown on the printed circuit board (PCB) to determine whether the physical circuit board (PCB) 10 matches the circuit board design/artwork, or whether translation errors are present. In another example, the virtual reality environment scope 90 may be employed with probing methods, such as those described with reference to FIGS. 1-4, in which when the probe 15 approaches a pad, i.e., contact point 20 on the printed circuit board 10, the name of the location of the pad is displayed on the printed circuit board 10 via augmented reality. In another embodiment, when a pad on the printed circuit board 10 is selected, the trace image 70 through the printed circuit board (PCB) 10 is displayed real-time to allow for recognition of a signal path running past high noise components of the printed circuit board (PCB) 10.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of structures, systems and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of probing printed circuit boards comprising:
   providing a circuit board design on a printed circuit board including a plurality of probe points;
   selecting a probe point including a location ink from the plurality of probe points in the circuit board design to be probed on the printed circuit board, the probe points of the circuit board design each having a different characteristic in the location ink that is specific to said each of the plurality of probe points; and
   probing the selected probe point of the plurality of probe points with a probe that activates the location ink, wherein activation of the location ink by the probe indicates the selected probe point including said location ink to reduce translation errors between the circuit board design and the printed circuit board by measuring the different characteristic in the location ink that is specific to said each of the plurality of probe points.

2. The method of claim 1, wherein the location ink comprises thermochromatic ink, wherein said activation of the location ink by the probe includes heating said at least one probe point to a predetermined temperature that illuminates said thermochromatic ink.

3. The method of claim 2, wherein the thermochromatic ink includes a liquid crystal composition, Leuco dye or a combination thereof.

4. A method of probing printed circuit boards comprising:
   providing a circuit board design on a printed circuit board including a plurality of probe points;
   selecting a probe point including a location ink from the plurality of probe points in the circuit board design to be probed on the printed circuit board, the probe points of the circuit board design each having a different characteristic in the location ink that is specific to said each of the plurality of probe points; and
   probing the selected probe point of the plurality of probe points with a probe that activates the location ink, wherein activation of the location ink by the probe indicates the selected probe point including said locating ink, wherein the selected probe point includes an assembly of a thermochromatic activator head including at least one of a peltier device and a piezoelectric device for heating or cooling that is atop a thermochromatic ring containing said location ink, wherein the thermochromatic ring contains said locating ink and is positioned around a conductive feature for the at least one probe point, wherein the conductive feature for the at least one probe point is in electrical communication with a trace line of the printed circuit board.

* * * * *